(12) United States Patent
Jain et al.

(10) Patent No.: US 11,502,603 B2
(45) Date of Patent: Nov. 15, 2022

(54) MAGNETIC SENSING SCHEME FOR VOLTAGE REGULATOR CIRCUIT

(71) Applicant: Intel Corporation, Santa Clara, CA (US)

(72) Inventors: Amit Kumar Jain, Portland, OR (US); Chin Lee Kuan, Bentong (MY); Sameer Shekhar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 710 days.

(21) Appl. No.: 16/452,322

(22) Filed: Jun. 25, 2019

(65) Prior Publication Data

US 2019/0312513 A1    Oct. 10, 2019

(51) Int. Cl.
| | |
|---|---|
| *H02M 3/158* | (2006.01) |
| *H01F 27/28* | (2006.01) |
| *G01R 19/165* | (2006.01) |
| *G06F 1/26* | (2006.01) |
| *H01F 27/40* | (2006.01) |
| *G01R 33/028* | (2006.01) |
| *H02M 3/156* | (2006.01) |
| *H02M 1/00* | (2006.01) |

(52) U.S. Cl.
CPC ...... *H02M 3/158* (2013.01); *G01R 19/16504* (2013.01); *G01R 19/16576* (2013.01); *G01R 33/0283* (2013.01); *G06F 1/26* (2013.01); *H01F 27/28* (2013.01); *H01F 27/402* (2013.01); *H02M 1/0064* (2021.05); *H02M 3/156* (2013.01)

(58) Field of Classification Search
CPC .... H02M 3/158; H02M 1/0064; H02M 3/156; H02M 1/0009; G01R 19/16504; G01R 19/16576; G01R 33/0283; G06F 1/26; H01F 27/28; H01F 27/402
See application file for complete search history.

(56) References Cited

U.S. PATENT DOCUMENTS

| | | | | |
|---|---|---|---|---|
| 6,815,937 B2* | 11/2004 | Poon | ...................... | H02M 3/158 323/282 |
| 7,382,115 B2* | 6/2008 | Woo | ..................... | H02M 3/1588 323/284 |

(Continued)

OTHER PUBLICATIONS

Surinder P. Singh, "Output Ripple Voltage for Buck Switching Regulator," Texas Instruments Application Report, SLVA630A, Jan. 2014, 16 pages.

*Primary Examiner* — Kyle J Moody
(74) *Attorney, Agent, or Firm* — Schwabe, Williamson & Wyatt, P.C.

(57) ABSTRACT

Various embodiments provide a magnetic sensing scheme for a voltage regulator circuit. The voltage regulator circuit may include a first inductor (also referred to as an output inductor) coupled between a drive circuit and an output node. The voltage regulator circuit may further include a second inductor (also referred to as a sense inductor) having a first terminal coupled to the first inductor at a tap point between terminals of the first inductor. The second inductor may provide a sense voltage at a second terminal of the second inductor. A control circuit may control a state of the voltage regulator circuit based on the sense voltage to provide a regulated output voltage at the output node. Other embodiments may be described and claimed.

24 Claims, 5 Drawing Sheets

(56) References Cited

U.S. PATENT DOCUMENTS

2009/0273326 A1* 11/2009 Lipcsei .............. H02M 3/1588
                                                   323/282
2011/0221414 A1*  9/2011 Pigott ................ H02M 3/1588
                                                   323/283
2017/0346397 A1* 11/2017 Babazadeh .......... H02M 3/156

* cited by examiner

MAGNETIC SENSING SCHEME FOR VOLTAGE REGULATOR CIRCUIT

FIELD

Embodiments of the present invention relate generally to the technical field of electronic circuits, and more particularly to a magnetic sensing scheme for a voltage regulator circuit.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Some voltage regulators include a capacitor coupled to the output node that has a low effective series resistance (ESR). Low ESR capacitors enable lower power delivery load line. However, low ESR can cause stability problems in control schemes, such as hysteretic control, that rely on output voltage ripple information for effective control.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
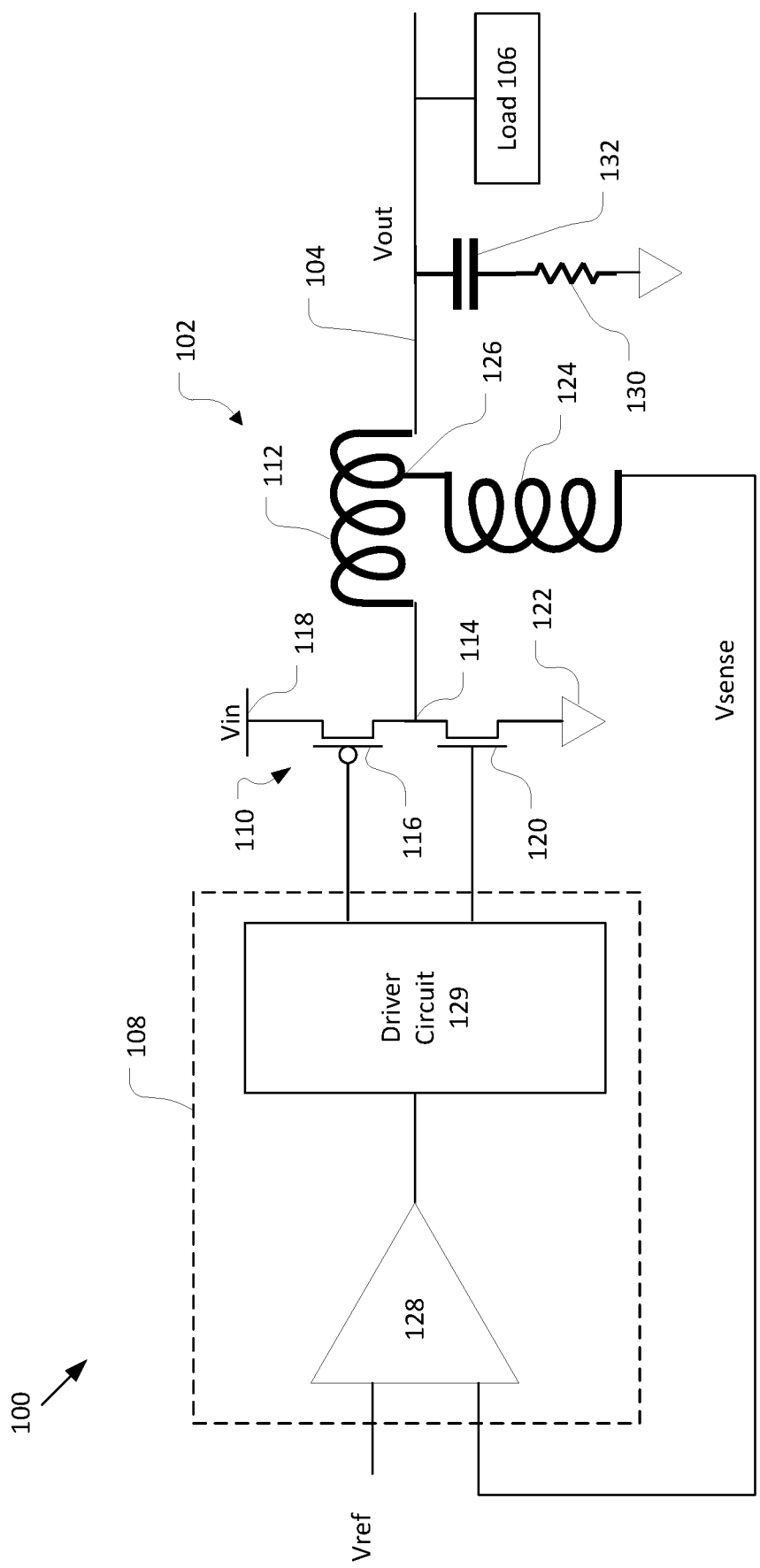
FIG. 1 illustrates a voltage regulator circuit, in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Various embodiments provide a sensing scheme (e.g., a magnetic sensing scheme) for a voltage regulator circuit to control a voltage regulator based on a sense voltage that may be based on an inductor current through an inductor of the voltage regulator, an input voltage of the voltage regulator, and an output voltage of the voltage regulator. The voltage regulator circuit may include a first inductor (also referred to as an output inductor) coupled to an output node. The voltage regulator circuit may further include a second inductor (also referred to as a sense inductor) having a first terminal coupled to the first inductor at a tap point between terminals of the first inductor. The second inductor may provide a sense voltage at a second terminal of the second inductor. A control circuit may control a state of the voltage regulator circuit based on the sense voltage to provide a regulated output voltage at the output node.

For example, the voltage regulator may include a pull-up transistor coupled between an input terminal and an intermediate node, wherein the output inductor is coupled between the intermediate node and the output node. The input terminal may receive an input voltage. The voltage regulator may further include a pull-down transistor coupled between the intermediate node and a ground terminal. The pull-up transistor, pull-down transistor, and first inductor may be included in an output stage of the voltage regulator.

The control circuit may, based on the sense voltage, switch the voltage regulator circuit between a first state (e.g., charge state) in which the pull-up transistor is on and the pull-up transistor is off, thereby causing the current provided to the output node through the output inductor to increase, and a second state (e.g., discharge state) in which the pull-up transistor is off and the pull-down transistor is on, thereby causing the current provided to the output node through the output inductor to decrease. The value of the sense voltage may be based on the current through the first inductor (e.g., the alternating current (AC) component of the current through the first inductor), the output voltage, and the input voltage.

FIG. 1 illustrates a voltage regulator circuit 100 (hereinafter "circuit 100"), in accordance with various embodiments. The circuit 100 may include a voltage regulator 102 coupled to an output node 104 to generate a regulated output voltage at the output node 104. The regulated output voltage may be provided to a load 106. The load 106 may include, for example, one or more circuit blocks that use the regulated output voltage as a power supply. The circuit 100 may further include a control circuit 108 to control operation of the voltage regulator 102.

In various embodiments, the voltage regulator 102 may include an output stage 110 that includes an output inductor 112. In some embodiments, the output inductor 112 may be coupled between the output node 104 and an internal/intermediate node 114 of the output stage 110. The output stage 110 may further include a pull-up transistor 116 (also referred to as a high-side transistor) coupled between the internal node 114 and an input terminal 118 (e.g., supply rail). The input terminal 118 may receive an input voltage Vin, which may be a direct current (DC) voltage. The output stage 110 may further include a pull-down transistor 120 (also referred to as a low-side transistor) coupled between the internal node 114 and a ground terminal 122.

In some embodiments, the control circuit 108 may include a comparator 128 and a driver circuit 129, as shown, to control operation of the bridge circuit 110 (e.g., pull-up transistor 116 and pull-down transistor 120).

It will be apparent that other embodiments of the circuit 100 may include a different design, additional/different components, and/or a different configuration of the control circuit 108, output stage 110, and/or other aspects of the circuit 100. For example, in some embodiments, the output stage 110 may include one or more additional transistors coupled between the input terminal 118 and the internal node 114 (e.g., in a cascode arrangement) and/or one or more additional transistors coupled between the internal node 114 and the ground terminal 122. Furthermore, while FIG. 1 depicts the pull-up transistor 116 as a p-type metal-oxide-semiconductor (PMOS) transistor and the pull-down transistor 120 as an n-type metal-oxide-semiconductor (NMOS) transistor, other embodiments may include a different type of transistor for the pull-up transistor 116 and/or pull-down transistor 120. Additionally, or alternatively, the control circuit 108 may include additional and/or different components (e.g., additional comparators and/or other logic) to perform the control scheme(s) described herein.

In various embodiments, the control circuit 108 may provide respective control signals to the gate terminals of the pull-up transistor 116 and pull-down transistor 120 (e.g., via driver circuit 129) to control a state of the voltage regulator. For example, when the voltage regulator 102 is in a first state (e.g., charge state), the pull-up transistor 116 may be on and the pull-down transistor 120 may be off. Accordingly, the output node 104 may be coupled to the supply rail 118 via the inductor 112 and pull-up transistor 116, thereby causing the current supplied from the DC-DC converter 102 to the output node 104 via the inductor 112 to increase.

When the voltage regulator 102 is in a second state (e.g., discharge state), the pull-up transistor 116 may be off and the pull-down transistor 120 may be on. Accordingly, the output node 104 may be coupled to the ground terminal 122 via the inductor 112 and pull-down transistor 120, thereby causing the current supplied from the voltage regulator 102 to the output node 104 via the output inductor 112 to decrease.

The circuit 100 may further include a sense inductor 124 with a first terminal coupled to the output inductor 112 at a tap point 126 that is between the terminals of the output inductor 112. A second terminal of the sense inductor 124 may be coupled to the control circuit 108 (e.g., a comparator 128 of the control circuit 108). The sense inductor 124 may provide a sense voltage to the control circuit 108 at the second terminal of the sense inductor 124. The control circuit 108 may control the state of the voltage regulator 102 based on the sense voltage.

In various embodiments, the sense voltage may be based on an inductor current through the output inductor 112 (e.g., an AC component of the inductor current), the input voltage Vin, and the output voltage Vout. In some embodiments, the sense voltage may be based on the input voltage Vin when the voltage regulator 102 is in the first state (e.g., charge state, with the pull-up transistor 116 on and the pull-down transistor 120 off), but not when the voltage regulator 102 is in the second state (e.g., discharge state, with the pull-up transistor 116 off and the pull-down transistor 120 on). For example, when the voltage regulator 102 is in the first state, the sense voltage, $V_{SENSE}$, may have a value according to Equation (1):

$$V_{SENSE} = K_1 I_{L\_AC} + (1-K_2)V_{OUT} + K_2 V_{IN} \quad (1)$$

wherein $I_{L\_AC}$ is an alternating current (AC) through the output inductor 112, $V_{OUT}$ is the output voltage at the output node 104, $V_{IN}$ is the input voltage at input terminal 118, $K_1$ is first scaling factor, and $K_2$ is a second scaling factor.

When the voltage regulator 102 is in the second state (discharge state), the sense voltage, $V_{SENSE}$, may have a value according to Equation (2):

$$V_{SENSE} = K_1 I_{L\_AC} + (1-K_2)V_{OUT} \quad (2)$$

Accordingly, the sense inductor 124 may be magnetically coupled with the output inductor 112 to generate a voltage component (e.g., $K_1 I_{L\_AC}$) of the sense voltage that is indicative of the AC current through the output inductor 112. The sense voltage may further include a voltage component (e.g., $(1-K_2)V_{OUT}$) based on the output voltage. Additionally, the sense voltage may include a voltage component (e.g., $K_2 V_{IN}$) based on the input voltage when the voltage regulator 102 is in the charge state but not when the voltage regulator 102 is in the discharge state.

The first scaling factor, $K_1$, may be a transformation ratio of the sense inductor 124 compared with the output inductor 112, for example based on a ratio of a number of turns of the sense inductor 124 compared with a number of turns of the output inductor 112. In some embodiments, the first scaling factor, $K_1$, may be given by Equation (3):

$$K_1 = \frac{N_1 \cdot A_1}{N \cdot A} \quad (3)$$

where $N_1$ is a number of turns in the sense inductor 124, $A_1$ is a cross-sectional area of the sense inductor 124, N is a number of turns in the output inductor 112, and A is a cross-sectional area of the output inductor 112. In some embodiments, the cross-sectional area of the sense inductor 124 may be less than the cross-sectional area of the output inductor 112. In other embodiments, the cross-sectional area of the sense inductor 124 may be the same as or greater than the cross-sectional area of the output inductor 112.

The second scaling factor, $K_2$, may be an inductance ratio between a portion of the output inductor 112 from the tap point 126 to the output node 104 compared with the output inductor 112 in total, for example based on the number of turns of the portion compared to a total number of turns of the output inductor. In some embodiments, the second scaling factor, $K_2$, may be given by Equation (4):

$$K_2 = \frac{N_2}{N} \qquad (4)$$

where $N_2$ is a number of turns in the portion of the output inductor 112 from the tap point 126 to the output node 104, and N is the number of turns in the output inductor 112.

As discussed above, the first scaling factor $K_1$ may scale the component of the sense voltage based on the inductor current, and the second scaling factor $K_2$ may scale the component of the sense voltage based on the input voltage and the output voltage (with a higher value of $K_2$ providing a greater contribution from the input voltage and a lower contribution from the output voltage). In some embodiments, the values of $K_1$ and $K_2$ may be less than one, such as significantly less than 1 (e.g., less than 0.10 or less than 0.01). The size/characteristics of the sense inductor 124 and/or location of the tap point 126 may be selected to provide suitable values of the first scaling factor and/or second scaling factor, respectively.

In some embodiments, the control circuit 108 may control the state of the voltage regulator 102 based on the sense voltage. For example, in some embodiments, the control circuit 108 may switch the voltage regulator 102 from the first state to the second state when the sense voltage is greater than a threshold, and switch the voltage regulator 102 from the second state to the first state when the sense voltage is less than the threshold. The control circuit 108 may include comparator 128 to determine whether the sense voltage is greater or less than the threshold (given by reference voltage Vref). In other embodiments, the control circuit 108 may use a different (e.g., higher) threshold for switching the voltage regulator 102 from the first state to the second state than for switching the voltage regulator 102 from the second state to the first state.

In some embodiments, the control circuit 108 may control the voltage regulator 102 in a full hysteretic mode, in which the voltage regulator 102 may switch solely between the charge state and the discharge state. Alternatively, or additionally, the voltage regulator 102 may be operable in a third state (e.g., tri-state mode or standby mode), both the pull-up transistor 116 and pull-down transistor 120 may be off. Accordingly, in the third state, the output node 104 may be uncoupled from both the supply rail 118 and the ground terminal 122. The control circuit 108 may switch the voltage regulator 102 from the discharge state to the tri-state mode when the inductor current through the output inductor 112 reaches zero (e.g., before the sense voltage drops below the voltage threshold). The control circuit 108 may switch the voltage regulator 102 from the tri-state mode to the charge state when the sense voltage drops below the voltage threshold. If the sense voltage falls below the voltage threshold prior to the inductor current reaching zero, the control circuit 108 may switch the voltage regulator 102 from the discharge state to the charge state, rather than first switching to the tri-state mode. It will be apparent that other control schemes based on the sense voltage are contemplated.

Accordingly, the control of the voltage regulator 102 based on the sense voltage provided by sense inductor 124, as described herein, may enable the control circuit 108 to respond to variations in the inductor current and the input voltage in addition to the output voltage. This may provide lower steady state and transient (e.g., during a voltage step/ramp) noise compared with prior solutions. Additionally, the circuit 100 may provide greater stability with low effective series resistance (ESR) of the output capacitor (shown in FIG. 1 as ESR 130 of output capacitor 132 coupled to the output node 104). Therefore, the circuit 100 may utilize an output capacitor 132 with lower ESR 130 (e.g., close to or at zero) than is possible with prior solutions while maintaining stability. The low ESR 130 further improves the performance of the circuit 100.

Additionally, the sense inductor 124 enables the sense voltage to include a voltage component based on the input voltage without additional circuitry apart from the sense inductor 124.

The sense inductor 124 and output inductor 112 may be implemented in any suitable way. For example, FIGS. 2, 3, and 4 illustrate some example implementations of the sense inductor 124 and output inductor 112.

Figure 2:
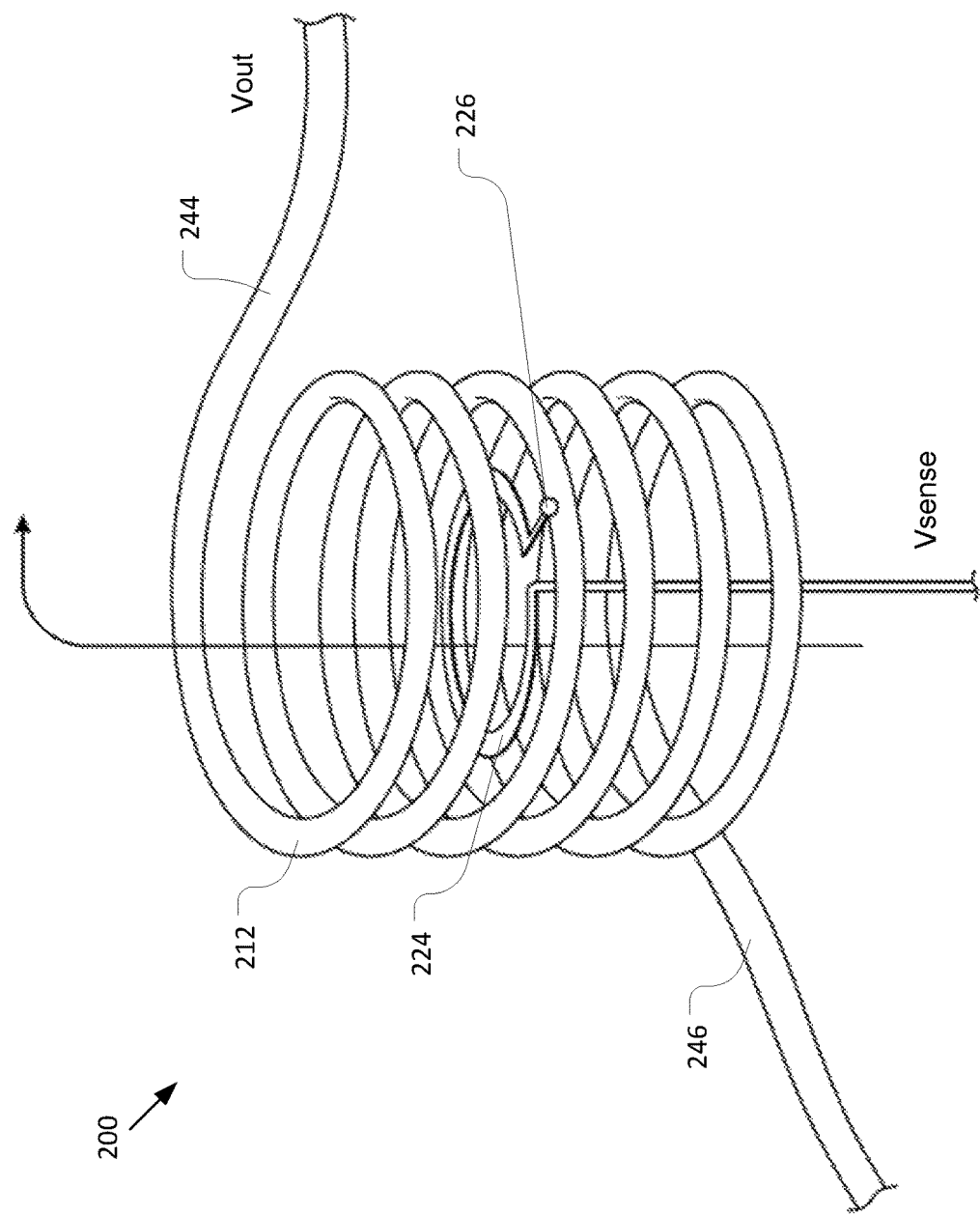
FIG. 2 illustrates a spiral wound output inductor and sense inductor, in accordance with various embodiments.

FIG. 2 illustrates an inductor structure 200 with an output inductor 212 and sense inductor 224 as spiral-wound inductors, in accordance with one example implementation. The spiral-wound inductors 212 and 224 may be a spiral of one or more turns of a conductive material, such as copper and/or another suitable conductor. As shown, a first terminal of the sense inductor 224 may be coupled to the output inductor 212 at a tap point 226 between the terminals of the output inductor 212, and the sense voltage may be provided at a second terminal of the sense inductor 224. A first terminal 244 of the output inductor may be coupled to the output node to provide the output voltage, and a second terminal 246 of the output inductor 212 may be coupled to the intermediate node between the pull-up and pull-down transistors (not shown in FIG. 2).

Figure 3:
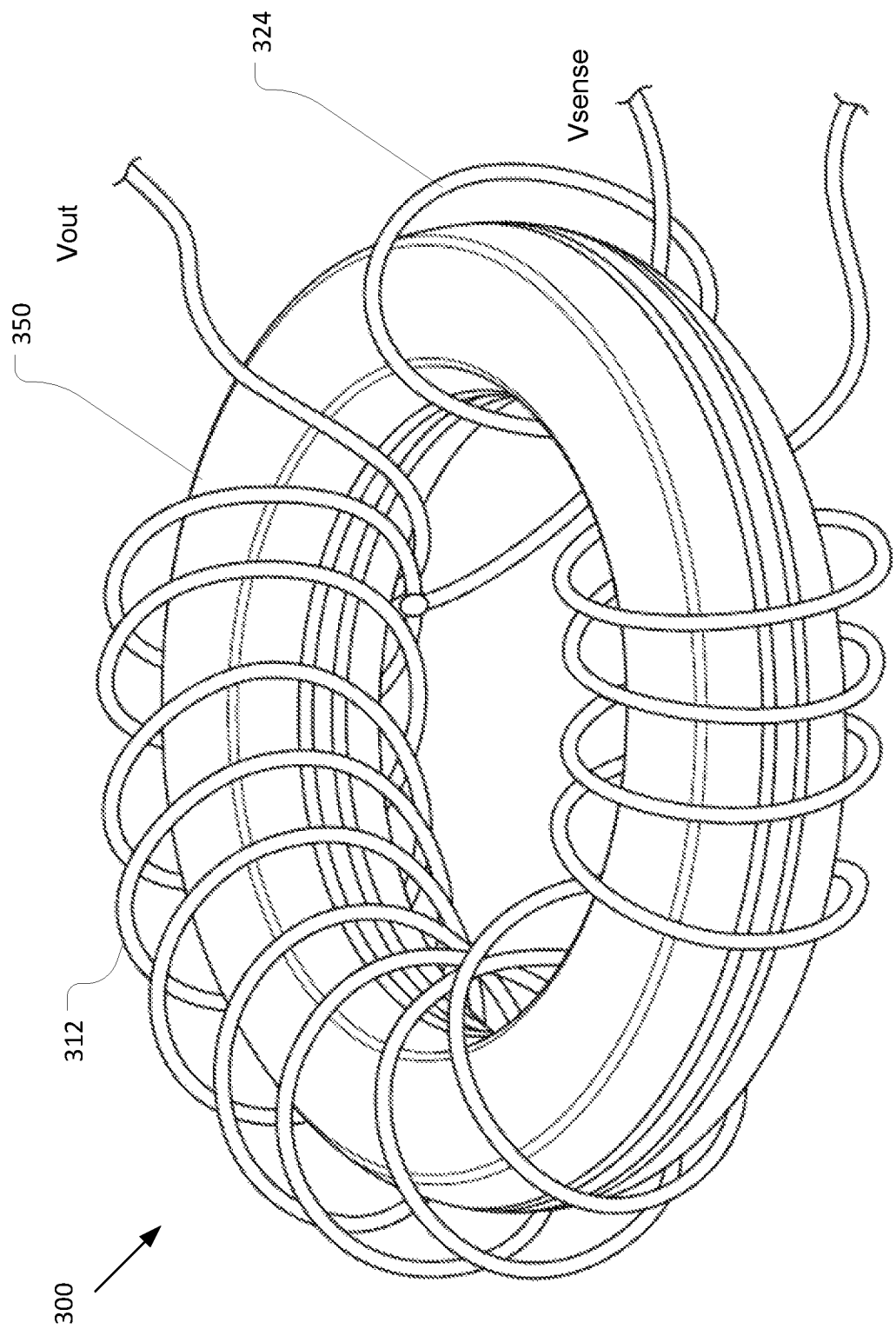
FIG. 3 illustrates a toroidal output inductor and sense inductor, in accordance with various embodiments.

FIG. 3 illustrates another example implementation of an inductor structure 300, in which an output inductor 312 and a sense inductor 324 are toroidal inductors. Accordingly, the output inductor 312 and sense inductor 324 may each include a conductive material that is wound around a core 350. The core 350 may be a donut shape as shown, or another suitable shape. The core 350 may include any suitable material, such as a ferromagnetic material (e.g., iron) and/or a non-ferromagnetic material (e.g., plastic), etc.

Figure 4:
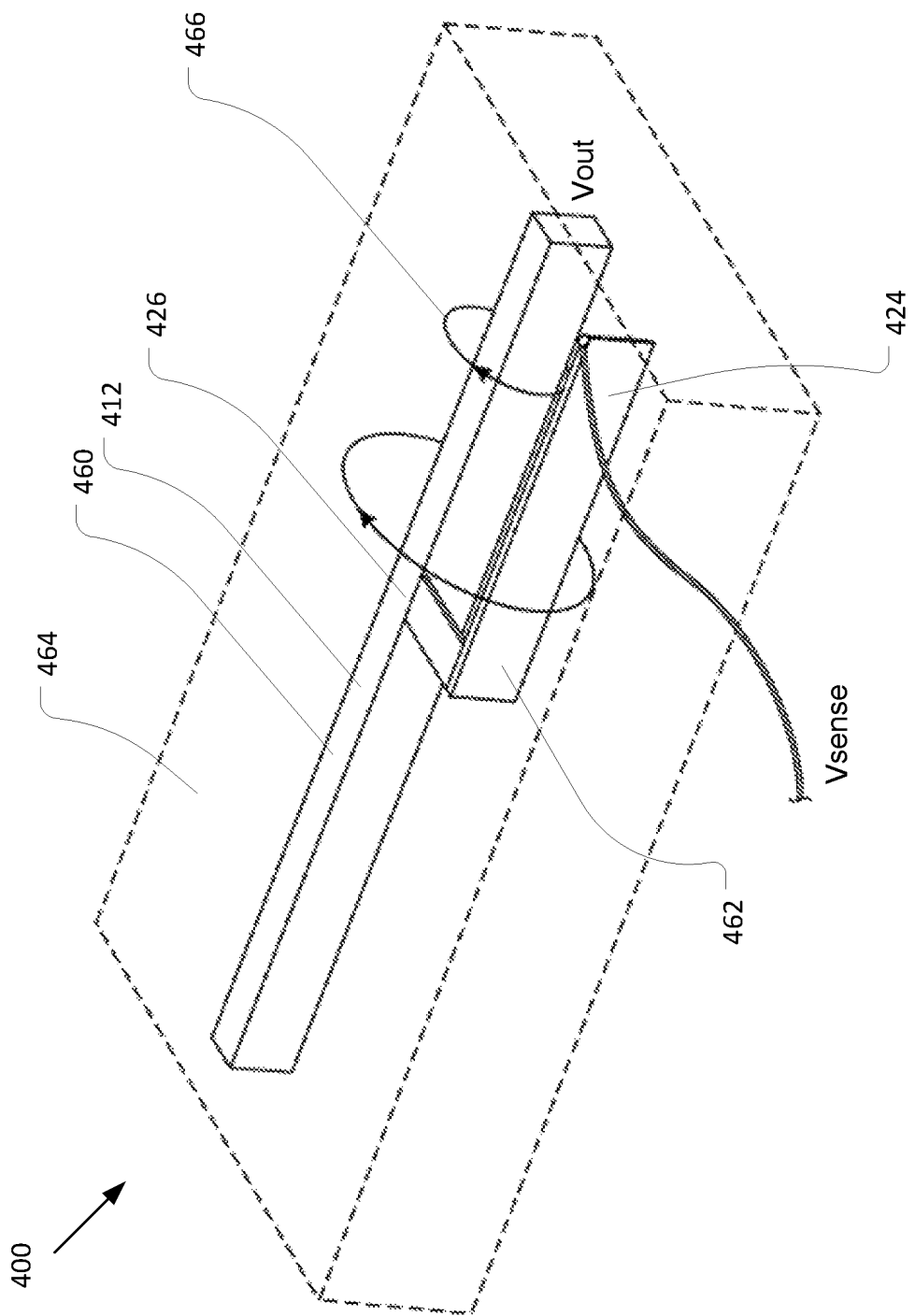
FIG. 4 illustrates a coaxial output inductor and sense inductor, in accordance with various embodiments.

FIG. 4 illustrates another example implementation of an inductor structure 400, in which the output inductor 412 and sense inductor 424 are coaxial inductors. Accordingly, the output inductor 412 and sense inductor 424 may be formed of respective strips of conductive material 460 and 462 embedded within a magnetic material 464. Accordingly, the current through the inductor 412 may flow linearly along the longitudinal axis of the conductive material 460, and the magnetic flux 466 may emanate in circles around the conductive material 460. A portion of the magnetic flux may be sensed by the sense inductor 424 to generate the component of the sense voltage based on the inductor current through the output inductor 412. In some embodiments, the strips of conductive material 460 and 462 may be substantially parallel with one another. The conductive material 462 may be coupled with the conductive material 460 at a tap point 426.

Figure 5:
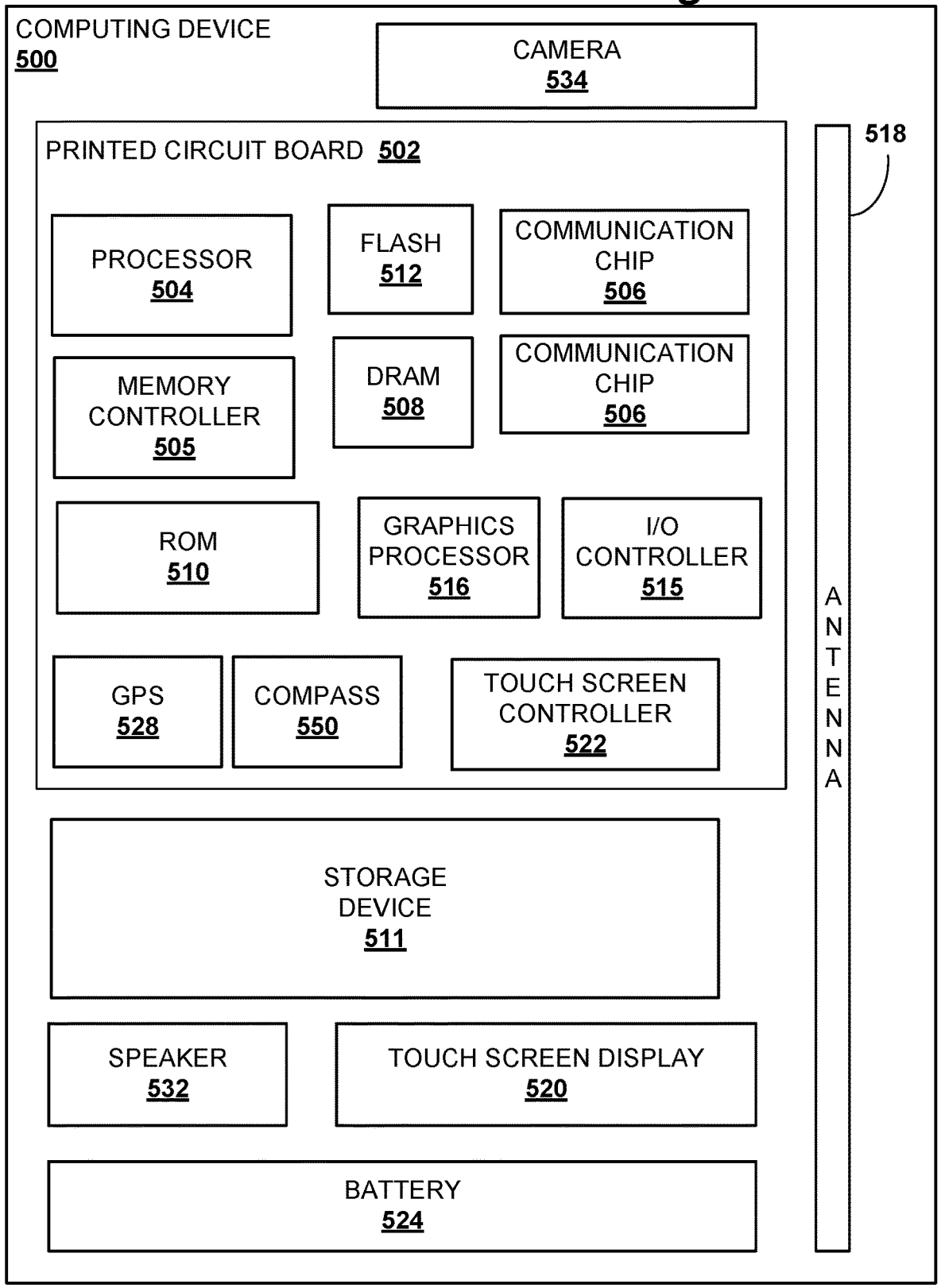
FIG. 5 illustrates an example system configured to employ the apparatuses and methods described herein, in accordance with various embodiments.

FIG. 5 illustrates an example computing device 500 that may employ the apparatuses and/or methods described herein (e.g., circuit 100, voltage regulator 102, and/or the inductor structures 200, 300, and/or 400, etc.), in accordance with various embodiments. As shown, computing device 500 may include a number of components, such as one or more processor(s) 504 (one shown) and at least one communication chip 506. In various embodiments, the one or more processor(s) 504 each may include one or more processor cores. In various embodiments, the at least one communication chip 506 may be physically and electrically coupled to the one or more processor(s) 504. In further implementations, the communication chip 506 may be part of the one or more processor(s) 504. In various embodiments, computing device 500 may include printed circuit board (PCB) 502. For these embodiments, the one or more processor(s) 504 and communication chip 506 may be disposed thereon. In alternate embodiments, the various components may be coupled without the employment of PCB 502.

Depending on its applications, computing device 500 may include other components that may or may not be physically and electrically coupled to the PCB 502. These other components include, but are not limited to, memory controller 505, volatile memory (e.g., dynamic random access memory (DRAM) 508), non-volatile memory such as read only memory (ROM) 510, flash memory 512, storage device 511 (e.g., a hard-disk drive (HDD)), an I/O controller 514, a digital signal processor (not shown), a crypto processor (not shown), a graphics processor 516, one or more antenna 518, a display (not shown), a touch screen display 520, a touch screen controller 522, a battery 524, an audio codec (not shown), a video codec (not shown), a global positioning system (GPS) device 528, a compass 530, an accelerometer (not shown), a gyroscope (not shown), a speaker 532, a camera 534, and a mass storage device (such as hard disk drive, a solid state drive, compact disk (CD), digital versatile disk (DVD)) (not shown), and so forth. In various embodiments, the processor 504 may be integrated on the same die with other components to form a System on Chip (SoC).

In some embodiments, the one or more processor(s) 504, flash memory 512, and/or storage device 511 may include associated firmware (not shown) storing programming instructions configured to enable computing device 500, in response to execution of the programming instructions by one or more processor(s) 504, to practice all or selected aspects of the methods described herein. In various embodiments, these aspects may additionally or alternatively be implemented using hardware separate from the one or more processor(s) 504, flash memory 512, or storage device 511.

In various embodiments, one or more components of the computing device 500 may include circuit 100, voltage regulator 102, and/or the inductor structures 200, 300, and/or 400, and/or otherwise employ techniques described herein. For example, the processor 504, communication chip 506, I/O controller 514, memory controller 505, and/or another component of computing device 500 may include circuit 100, voltage regulator 102, and/or the inductor structures 200, 300, and/or 400, and/or otherwise employ techniques described herein.

The communication chips 506 may enable wired and/or wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to IEEE 702.20, Long Term Evolution (LTE), LTE Advanced (LTE-A), 5G, General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth, and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an automobile, a medical device, an appliance, a portable music player, a digital video recorder, an electronic sensor, a smart home device, an internet of things (IoT) device, etc. In further implementations, the computing device 500 may be any other electronic device that processes data.

Some non-limiting Examples of various embodiments are described below.

Example 1 is a voltage regulator circuit comprising: a pull-up transistor coupled between an intermediate node and a supply rail that is to receive an input voltage; a pull-down transistor coupled between the intermediate node and a ground terminal; a first inductor coupled between the intermediate node and an output node to provide a regulated output voltage at the output node; a second inductor having a first terminal coupled to the first inductor at a tap point between terminals of the first inductor, wherein the second inductor is magnetically coupled to the first inductor, and wherein the second inductor is to provide a sense voltage at a second terminal of the second inductor; and a control circuit to receive the sense voltage and to control the pull-up transistor and the pull-down transistor based on the sense voltage.

Example 2 is the voltage regulator circuit of Example 1, wherein the control circuit includes: a comparator to compare the sense voltage to a reference voltage; and a driver circuit to control the pull-up transistor and the pull-down transistor based on the comparison.

Example 3 is the voltage regulator circuit of Example 2, wherein the control circuit is to: turn on the pull-up transistor and turn off the pull-down transistor if the sense voltage is less than the reference voltage; and turn off the pull-up transistor and turn on the pull-down transistor if the sense voltage is greater than the reference voltage.

Example 4 is the voltage regulator circuit of Example 1, wherein the sense voltage is based on a current through the first inductor, the input voltage, and the regulated output voltage.

Example 5 is the voltage regulator circuit of Example 1, wherein, when the pull-up transistor is on and the pull-down transistor is off, the sense voltage has a value according to:

$$V_{SENSE}=K_1 I_{L\_AC}+(1-K_2)V_{OUT}+K_2 V_{IN}$$

wherein $V_{SENSE}$ is the sense voltage, $I_{L\_AC}$ is an alternating current (AC) through the first inductor, $V_{OUT}$ is the output voltage, $V_{IN}$ is the input voltage, $K_1$ is a transformation ratio of the second inductor compared with the first inductor, and $K_2$ is an inductance ratio between a portion of the first inductor from the tap point to the output node compared with the first inductor in total.

Example 6 is the voltage regulator circuit of Example 5, wherein, when the pull-up transistor is off and the pull-down transistor is on, the sense voltage has a value according to:

$$V_{SENSE}=K_1 I_{L\_AC}+(1-K_2)V_{OUT}.$$

Example 7 is the voltage regulator circuit of Example 5, wherein $K_1$ has a value according to:

$$K_1 = \frac{N_1 \cdot A_1}{N \cdot A}$$

where $N_1$ is a number of turns in the second inductor, $A_1$ is a cross-sectional area of the second inductor, N is a number of turns in the first inductor, and A is a cross-sectional area of the first inductor; wherein the cross-sectional area of the second inductor is less than the cross-sectional area of the first inductor.

Example 8 is the voltage regulator circuit of Example 1, wherein the first and second inductors are spiral wound inductors.

Example 9 is the voltage regulator circuit of Example 1, wherein the first and second inductors are toroidal inductors.

Example 10 is the voltage regulator circuit of Example 1, wherein the first and second inductors are coaxial inductors having respective straight conductors embedded in a magnetic material.

Example 11 is a circuit comprising: an output stage to receive an input voltage and provide a regulated output voltage at an output node, the output stage including an inductor; a feedback circuit to provide a feedback signal based on an inductor current through the inductor, an input voltage, and the regulated output voltage; and a control circuit to control operation of the output stage based on the feedback signal.

Example 12 is the circuit of Example 11, wherein the inductor is coupled between the output node and an intermediate node of the output stage, and wherein the output stage further includes: a pull-up transistor coupled between the intermediate node and an input terminal that is to receive the input voltage; a pull-down transistor coupled between the intermediate node and a ground terminal.

Example 13 is the circuit of Example 12, wherein the control circuit is to: turn on the pull-up transistor and turn off the pull-down transistor if the sense voltage is less than a first voltage threshold; and turn off the pull-up transistor and turn on the pull-down transistor if the sense voltage is greater than a second voltage threshold.

Example 14 is the circuit of Example 12, wherein the second voltage threshold is the same as the first voltage threshold.

Example 15 is the circuit of Example 11, wherein the inductor is a first inductor, and wherein the feedback circuit includes a second inductor with a first terminal coupled to the first inductor at a tap point between terminals of the first inductor, wherein the second inductor is to provide the feedback signal at a second terminal of the second inductor.

Example 16 is the circuit of Example 15, wherein the output stage is controllable by the control circuit to be in a charge state in which the inductor current is to increase and a discharge state in which the inductor current is to decrease, and wherein, when the output stage is in the charge state, the sense voltage has a value according to:

$$V_{SENSE}=K_1 I_{L\_AC}+(1-K_2)V_{OUT}+K_2 V_{IN}$$

wherein $V_{SENSE}$ is the sense voltage, $I_{L\_AC}$ is an alternating current (AC) component of the inductor current, $V_{OUT}$ is the output voltage, $V_{IN}$ is the input voltage, $K_1$ is a transformation ratio of the second inductor compared with the first inductor, and $K_2$ is an inductance ratio between a portion of the first inductor from the tap point to the output node compared with the first inductor in total.

Example 17 is the circuit of Example 16, wherein, when the output stage is in the discharge state, the sense voltage has a value according to:

$$V_{SENSE}=K_1 I_{L\_AC}+(1-K_2)V_{OUT}.$$

Example 18 is the circuit of Example 16, wherein $K_1$ has a value according to:

$$K_1 = \frac{N_1 \cdot A_1}{N \cdot A}$$

where $N_1$ is a number of turns in the second inductor, $A_1$ is a cross-sectional area of the second inductor, N is a number of turns in the first inductor, and A is a cross-sectional area of the first inductor; wherein the cross-sectional area of the second inductor is less than the cross-sectional area of the first inductor.

Example 19 is a computing system comprising: a motherboard; and an integrated circuit die mounted to the motherboard, the integrated circuit die comprising: a circuit block; and a voltage regulator to provide a regulated output voltage to the circuit block at an output node, wherein the voltage regulator is operable in a charge mode and a discharge mode. The voltage regulator includes: a first inductor coupled to the output node; a second inductor having a first terminal coupled to the first inductor at a tap point between terminals of the first inductor, wherein the second inductor is magnetically coupled to the first inductor, and wherein the second inductor is to provide a sense voltage at a second terminal of the second inductor. The integrated circuit die further includes a control circuit to receive the sense voltage and to switch the voltage regulator between the charge mode and the discharge mode based on the sense voltage.

Example 20 is the computing system of Example 19, wherein the inductor is coupled between the output node and an intermediate node, and wherein the voltage regulator further includes: a pull-up transistor coupled between the intermediate node and an input terminal that is to receive an input voltage; and a pull-down transistor coupled between the intermediate node and a ground terminal; wherein, when the voltage regulator is in the charge state, the pull-up transistor is to be on and the pull-down transistor is to be off;

and wherein, when the voltage regulator is in the discharge state, the pull-up transistor is to be off and the pull-down transistor is to be on.

Example 21 is the computing system of Example 19, wherein the control circuit is to: switch the voltage regulator from the discharge state to the charge state based on a first detection that the sense voltage is less than a reference voltage; and switch the voltage regulator from the charge state to the discharge state based on a second detection that the sense voltage is greater than the reference voltage.

Example 22 is the computing system of Example 19, wherein the sense voltage is based on a current through the first inductor, an input voltage to be received by the voltage regulator, and the regulated output voltage.

Example 23 is the computing system of Example 19, wherein, when the voltage regulator is in the charge state, the sense voltage has a value according to:

$$V_{SENSE}=K_1 I_{L\_AC}+(1-K_2)V_{OUT}+K_2 V_{IN}$$

wherein $V_{SENSE}$ is the sense voltage, $I_{L\_AC}$ is an alternating current (AC) through the first inductor, $V_{OUT}$ is the output voltage, $V_{IN}$ is an input voltage to be received by the voltage regulator, $K_1$ is a transformation ratio of the second inductor compared with the first inductor, and $K_2$ is an inductance ratio between a portion of the first inductor from the tap point to the output node compared with the first inductor in total.

Example 24 is the computing system of Example 23, wherein, when the voltage regulator is in the discharge state, the sense voltage has a value according to:

$$V_{SENSE}=K_1 I_{L\_AC}+(1-K_2)V_{OUT}$$

Example 25 is the computing system of Example 19, further comprising one or more of a memory circuit, a display, or an antenna coupled to the integrated circuit die.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:
1. A voltage regulator circuit comprising:
a pull-up transistor coupled between an intermediate node and a supply rail that is to receive an input voltage;
a pull-down transistor coupled between the intermediate node and a ground terminal;
a first inductor coupled between the intermediate node and an output node to provide a regulated output voltage at the output node;
a second inductor having a first terminal coupled to the first inductor at a tap point between terminals of the first inductor, wherein the second inductor is magnetically coupled to the first inductor, and wherein the second inductor is to provide a sense voltage at a second terminal of the second inductor; and
a control circuit to receive the sense voltage and to control the pull-up transistor and the pull-down transistor based on the sense voltage.

2. The voltage regulator circuit of claim 1, wherein the control circuit includes:
a comparator to compare the sense voltage to a reference voltage; and
a driver circuit to control the pull-up transistor and the pull-down transistor based on the comparison.

3. The voltage regulator circuit of claim 2, wherein the control circuit is to:
turn on the pull-up transistor and turn off the pull-down transistor if the sense voltage is less than the reference voltage; and
turn off the pull-up transistor and turn on the pull-down transistor if the sense voltage is greater than the reference voltage.

4. The voltage regulator circuit of claim 1, wherein the sense voltage is based on a current through the first inductor, the input voltage, and the regulated output voltage.

5. The voltage regulator circuit of claim 1, wherein, when the pull-up transistor is on and the pull-down transistor is off, the sense voltage has a value according to:

$$V_{SENSE}=K_1 I_{L\_AC}+(1-K_2)V_{OUT}+K_2 V_{IN} \quad (1)$$

wherein $V_{SENSE}$ is the sense voltage, $I_{L\_AC}$ is an alternating current (AC) through the first inductor, $V_{OUT}$ is the output voltage, $V_{IN}$ is the input voltage, $K_1$ is a transformation ratio of the second inductor compared with the first inductor, and $K_2$ is an inductance ratio between a portion of the first inductor from the tap point to the output node compared with the first inductor in total.

6. The voltage regulator circuit of claim 5, wherein, when the pull-up transistor is off and the pull-down transistor is on, the sense voltage has a value according to:

$$V_{SENSE}=K_1 I_{L\_AC}+(1-K_2)V_{OUT}$$

7. The voltage regulator circuit of claim 5, wherein $K_1$ has a value according to:

$$K_1 = \frac{N_1 \cdot A_1}{N \cdot A}$$

where $N_1$ is a number of turns in the second inductor, $A_1$ is a cross-sectional area of the second inductor, $N$ is a number of turns in the first inductor, and $A$ is a cross-sectional area of the first inductor; and
wherein the cross-sectional area of the second inductor is less than the cross-sectional area of the first inductor.

8. The voltage regulator circuit of claim 1, wherein the first and second inductors are spiral wound inductors.

9. The voltage regulator circuit of claim 1, wherein the first and second inductors are toroidal inductors.

10. The voltage regulator circuit of claim 1, wherein the first and second inductors are coaxial inductors having respective straight conductors embedded in a magnetic material.

11. A circuit comprising:
an output stage to receive an input voltage and provide a regulated output voltage at an output node, the output stage including a first inductor;
a feedback circuit to provide a feedback signal based on an inductor current through the first inductor, the input voltage, and the regulated output voltage, wherein the feedback circuit includes a second inductor with a first terminal coupled to the first inductor at a tap point between terminals of the first inductor, and wherein the second inductor is to provide the feedback signal at a second terminal of the second inductor; and
a control circuit to control operation of the output stage based on the feedback signal.

12. The circuit of claim 11, wherein the inductor is coupled between the output node and an intermediate node of the output stage, and wherein the output stage further includes:
a pull-up transistor coupled between the intermediate node and an input terminal that is to receive the input voltage; and
a pull-down transistor coupled between the intermediate node and a ground terminal.

13. The circuit of claim 12, wherein the control circuit is to:
turn on the pull-up transistor and turn off the pull-down transistor if the feedback signal is less than a first voltage threshold; and
turn off the pull-up transistor and turn on the pull-down transistor if the feedback signal is greater than a second voltage threshold.

14. The circuit of claim 13, wherein the second voltage threshold is the same as the first voltage threshold.

15. The circuit of claim 11, wherein the output stage is controllable by the control circuit to be in a charge state in which the inductor current is to increase and a discharge state in which the inductor current is to decrease, and wherein, when the output stage is in the charge state, the feedback signal has a value according to:

$$V_{SENSE}=K_1 I_{L\_AC}+(1-K_2)V_{OUT} K_2 V_{IN}$$

wherein $V_{SENSE}$ is the feedback signal, $I_{L\_AC}$ is an alternating current (AC) component of the inductor current, $V_{OUT}$ is the output voltage, $V_{IN}$ is the input voltage, $K_1$ is a transformation ratio of the second inductor compared with the first inductor, and $K_2$ is an inductance ratio between a portion of the first inductor from the tap point to the output node compared with the first inductor in total.

16. The circuit of claim 15, wherein, when the output stage is in the discharge state, the feedback signal has a value according to:

$$V_{SENSE}=K_1 I_{L\_AC}+(1-K_2)V_{OUT}$$

17. The circuit of claim 15, wherein $K_1$ has a value according to:

$$K_1 = \frac{N_1 \cdot A_1}{N \cdot A}$$

where $N_1$ is a number of turns in the second inductor, $A_1$ is a cross-sectional area of the second inductor, N is a number of turns in the first inductor, and A is a cross-sectional area of the first inductor; and
wherein the cross-sectional area of the second inductor is less than the cross-sectional area of the first inductor.

18. A computing system comprising:
a motherboard; and
an integrated circuit die mounted to the motherboard, the integrated circuit die comprising:
a circuit block; and
a voltage regulator to provide a regulated output voltage to the circuit block at an output node, wherein the voltage regulator is operable in a charge mode and a discharge mode, and wherein the voltage regulator includes:
a first inductor coupled to the output node;
a second inductor having a first terminal coupled to the first inductor at a tap point between terminals of the first inductor, wherein the second inductor is magnetically coupled to the first inductor, and wherein the second inductor is to provide a sense voltage at a second terminal of the second inductor; and
a control circuit to receive the sense voltage and to switch the voltage regulator between the charge mode and the discharge mode based on the sense voltage.

19. The computing system of claim 18, wherein the inductor is coupled between the output node and an intermediate node, and wherein the voltage regulator further includes:
a pull-up transistor coupled between the intermediate node and an input terminal that is to receive an input voltage; and
a pull-down transistor coupled between the intermediate node and a ground terminal;
wherein, when the voltage regulator is in the charge state, the pull-up transistor is to be on and the pull-down transistor is to be off; and
wherein, when the voltage regulator is in the discharge state, the pull-up transistor is to be off and the pull-down transistor is to be on.

20. The computing system of claim 18, wherein the control circuit is to:
switch the voltage regulator from the discharge state to the charge state based on a first detection that the sense voltage is less than a reference voltage; and
switch the voltage regulator from the charge state to the discharge state based on a second detection that the sense voltage is greater than the reference voltage.

21. The computing system of claim 18, wherein the sense voltage is based on a current through the first inductor, an input voltage to be received by the voltage regulator, and the regulated output voltage.

22. The computing system of claim 18, wherein, when the voltage regulator is in the charge state, the sense voltage has a value according to:

$$V_{SENSE}=K_1 I_{L\_AC}+(1-K_2)V_{OUT} K_2 V_{IN}$$

wherein $V_{SENSE}$ is the sense voltage, $I_{L\_AC}$ is an alternating current (AC) through the first inductor, $V_{OUT}$ is the output voltage, $V_{IN}$ is an input voltage to be received by the voltage regulator, $K_1$ is a transformation ratio of the second inductor compared with the first inductor, and $K_2$ is an inductance ratio between a portion of the first inductor from the tap point to the output node compared with the first inductor in total.

23. The computing system of claim 22, wherein, when the voltage regulator is in the discharge state, the sense voltage has a value according to:

$$V_{SENSE}=K_1 I_{L\_AC}+(1-K_2)V_{OUT}$$

24. The computing system of claim 18, further comprising one or more of a memory circuit, a display, or an antenna coupled to the integrated circuit die.

* * * * *